US011133891B2

(12) United States Patent
Muzaffar et al.

(10) Patent No.: US 11,133,891 B2
(45) Date of Patent: Sep. 28, 2021

(54) SYSTEMS AND METHODS FOR SELF-SYNCHRONIZED COMMUNICATIONS

(71) Applicant: Khalifa University of Science and Technology, Abu Dhabi (AE)

(72) Inventors: Shahzad Muzaffar, Abu Dhabi (AE); Ibrahim Elfadel, Abu Dhabi (AE)

(73) Assignee: Khalifa University of Science and Technology, Abu Dhabi (AE)

( * ) Notice: Subject to any disclaimer, the term of this patent is extended or adjusted under 35 U.S.C. 154(b) by 110 days.

(21) Appl. No.: 16/023,356

(22) Filed: Jun. 29, 2018

(65) Prior Publication Data

US 2020/0007271 A1 Jan. 2, 2020

(51) Int. Cl.
*H04L 1/00* (2006.01)

(52) U.S. Cl.
CPC .......... *H04L 1/0036* (2013.01); *H04L 1/0042* (2013.01); *H04L 1/0053* (2013.01); *H04L 1/0064* (2013.01)

(58) Field of Classification Search
CPC ... H04L 1/0036; H04L 1/0042; H04L 1/0064; H04L 1/0053; H04L 7/00; H04L 25/4904; H04L 25/49; H03M 5/08; H03M 7/3059; H03M 7/14; H04J 3/0602
See application file for complete search history.

(56) References Cited

U.S. PATENT DOCUMENTS

| 5,282,200 | A | * | 1/1994 | Dempsey | ................. | H04J 3/085 370/245 |
| 6,285,722 | B1 | * | 9/2001 | Banwell | ................... | H04L 7/027 375/354 |
| 6,366,223 | B1 | * | 4/2002 | Lee | ......................... | H03M 5/04 341/51 |
| 6,970,435 | B1 | * | 11/2005 | Buchanan | ............... | H04L 1/205 370/216 |
| 10,134,402 | B2 | | 11/2018 | Zhou et al. | | |
| 10,832,688 | B2 | | 11/2020 | Zhou et al. | | |
| 2001/0010712 | A1 | * | 8/2001 | Hedberg | ............. | H04L 25/0262 375/296 |
| 2003/0219004 | A1 | * | 11/2003 | Liu | ...................... | H04L 25/4923 370/350 |
| 2004/0095020 | A1 | * | 5/2004 | Kernahan | ............. | H02M 3/156 307/35 |

(Continued)

OTHER PUBLICATIONS

Svetlov et al., "Self-synchronized encoding and decoding algorithms based on code signal feature", Jun. 1, 2017 (https://ieeexplore.ieee.org/document/7936641) (Year: 2017).*

(Continued)

*Primary Examiner* — Un C Cho
*Assistant Examiner* — Kenan Cehic
(74) *Attorney, Agent, or Firm* — Withrow & Terranova, PLLC

(57) ABSTRACT

A method for transmitting a data block begins with segmenting the data block into a number of data sub-blocks. Each data sub-block where a number of high bits is greater than a number of low bits is then inverted. The data sub-blocks are then grouped into sets of data sub-blocks. For each set of data sub blocks, a number of pulses indicative of a number of high bits in each one of the data sub-blocks in the set is transmitted, there is a delay, and a number of pulses indicative of each high bit in each data sub-block of the set of data sub-blocks is transmitted followed by a delay. Finally, a number of pulses indicative of which ones of the data sub-blocks were inverted is transmitted.

14 Claims, 6 Drawing Sheets

(56) References Cited

U.S. PATENT DOCUMENTS

| | | | |
|---|---|---|---|
| 2004/0095264 A1* | 5/2004 | Thomas | H02M 3/1584 341/53 |
| 2004/0234015 A1* | 11/2004 | Janapaty | H04L 25/08 375/350 |
| 2004/0240599 A1* | 12/2004 | Takasoh | H03L 7/091 375/376 |
| 2004/0261001 A1* | 12/2004 | Chang | H04L 1/0057 714/784 |
| 2007/0092029 A1* | 4/2007 | Yu | H04L 1/0067 375/295 |
| 2008/0212606 A1* | 9/2008 | Batty | H03M 9/00 370/464 |
| 2008/0310572 A1* | 12/2008 | Futami | H04L 27/227 375/371 |
| 2009/0281811 A1 | 11/2009 | Oshikiri et al. | |
| 2009/0323735 A1* | 12/2009 | Kuksenkov | G02B 6/03644 372/6 |
| 2010/0153723 A1* | 6/2010 | Artus | H04L 9/0662 713/168 |
| 2010/0329186 A1* | 12/2010 | Lim | H04L 27/2615 370/328 |
| 2013/0290003 A1 | 10/2013 | Choo | |
| 2014/0214411 A1 | 7/2014 | Daimou et al. | |
| 2014/0219459 A1 | 8/2014 | Daniel et al. | |
| 2014/0355768 A1 | 12/2014 | Sen et al. | |
| 2015/0162011 A1 | 6/2015 | Qi et al. | |
| 2015/0206541 A1* | 7/2015 | Qi | G10L 19/032 704/229 |
| 2016/0049157 A1 | 2/2016 | Mittal et al. | |
| 2017/0223356 A1 | 8/2017 | Sung et al. | |
| 2017/0234970 A1* | 8/2017 | Harvey | G01S 7/032 342/195 |
| 2017/0309287 A1 | 10/2017 | Lee | |
| 2018/0131505 A1 | 5/2018 | Muzaffar et al. | |
| 2019/0190525 A1* | 6/2019 | Fredenburg | H03L 7/0998 |

OTHER PUBLICATIONS

Du, Qingjin, et al., "A 2.5 GB/s, Low Power Clock and Data Recovery Circuit," Canadian Conference on Electrical and Computer Engineering, Apr. 2007, IEEE, pp. 526-529.

Loh, Matthew, et al., "All-Digital CDR for High-Density, High-Speed I/O," IEEE Symposium on VLSI Circuits, Jun. 2010, 2 pages.

Loh, Matthew, et al., "A 3x9 GB/s Shared, All-Digital CDR for High-Speed, High-Density I/O," Journal of Solid-State Circuits, vol. 47, Issue 3, Mar. 2012, IEEE, pp. 641-651.

Muzaffar, S., et al., "A Pulsed-Data Technique for Single-channel, Dynamic Signaling for IoT Applications," International Conference on Very Large Scale Integration, Oct. 2017, Abu-Dhabi, 6 pages.

Muzaffar, S., et al., "A Pulsed-Index Technique for Single-Channel, Low Power, Dynamic Signaling," 2015 Design, Automation & Test in Europe Conference & Exhibition (Date), Mar. 9-13, 2015, Grenoble, France, pp. 1485-1490.

Muzaffar, S., et al., "Timing and Robustness Analysis of Pulsed-Index Protocols for Single-Channel IoT Communications," 2015 IFIP/IEEE International Conference on Very Large Scale Integration (VLSI-SoC), Oct. 5-7, 2015, Daejeon, South Korea, pp. 225-230.

Muzaffar, S., et al., "Power Management of Pulsed-Index Communication Protocols," 2015 33rd IEEE International Conference on Computer Design (ICCD), Oct. 18-21, 2015, New York, New York, USA, pp. 375-378.

Muzaffar, S., et al., "Single-clock-cycle, Multilayer Encryption Algorithm for Single-channel IoT Communications," 2017 IEEE Conference on Dependable and Secure Computing, Aug. 7-10, 2017, Taipei, Taiwan, pp. 153-158.

Razavi, Behzad, "Design of High-Speed Circuits for Optical Communication Systems," Custom Integrated Circuits Conference, 2001, IEEE, pp. 315-322.

Soh, Lip-Kai, et al., "A 2.5-12.5Gbps Interpolator-Based Clock and Data Recovery Circuit for FPGA," Asia Symposium on Quality Electronic Design, Jul. 2012, IEEE, 4 pages.

Urano, Yuki, et al., "A 1.26mW/Gbps 8 Locking Cycles Versatile All-Digital CDR with TDC combined DLL," International Symposium on Circuits and Systems, May 2013, IEEE, pp. 1576-1579.

Widmer, A.X., et al., "A DC-Balanced, Partitioned-Block, 8B/10b Transmission Code," IBM Journal of Research and Development, vol. 27, Issue 5, Sep. 1983, 13 pages.

Non-Final Office Action for U.S. Appl. No. 16/047,375, dated May 19, 2020, 12 pages.

Notice of Allowance for U.S. Appl. No. 16/047,375, dated Nov. 18, 2020, 9 pages.

* cited by examiner

SYSTEMS AND METHODS FOR SELF-SYNCHRONIZED COMMUNICATIONS

FIELD OF THE DISCLOSURE

The present disclosure relates to systems and methods for communicating between devices that do not require synchronization circuitry.

BACKGROUND

State of the art communications systems such as serial communications systems require synchronization between a transmitter and a receiver. This is commonly performed by clock and data recovery (CDR) circuitry in the receiver. While effective for enabling communication between the transmitter and the receiver, the CDR circuitry includes components such as a phase-lock loop (PLL), a charge pump, phase detectors, filters, and a sampler that consume a large amount of space and power. In modern devices such as those connected to the Internet of Things (IoT), space and power are limited. Accordingly, there is a need for systems and methods for communicating between devices that are self-synchronized and therefore do not require synchronization circuitry.

SUMMARY

In one embodiment, a method for transmitting a data block begins with segmenting the data block into a number of data sub-blocks. Each data sub-block where a number of high bits is greater than a number of low bits is inverted. The data sub-blocks are grouped into sets of data sub-blocks. For each set of data sub blocks, a number of pulses indicative of a number of high bits in each one of the data sub-blocks in the set is transmitted, there is a delay, and a number of pulses indicative of each high bit in each data sub-block of the set of data sub-blocks is transmitted followed by another delay. Finally, a number of pulses indicative of which ones of the data sub-blocks were inverted is transmitted. The foregoing method foregoes the need for synchronization between a transmitter and a receiver thus saving space and power therein. Further, the method provides a high data rate, high reliability, compatibility with packet security, and high efficiency (a low number of pulses).

In one embodiment, a method for decoding a pulsed data stream begins with receiving the pulsed data stream, where the pulsed data stream includes a number of pulse groups separated from one another by a delay. The pulse groups are grouped into sets of pulse groups. For each set of pulse groups, a number of pulses in each pulse group therein is counted, and the number of pulses in a first pulse group in the set of pulse groups is used to generate a number of data sub-blocks from the remaining pulse groups in the set of pulse groups. A number of pulses in a last pulse group in the pulsed data stream is counted, and certain ones of the data sub-blocks are inverted based on the number of pulses in the last pulse group. Finally, the data sub-blocks are concatenated to generate a data block.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
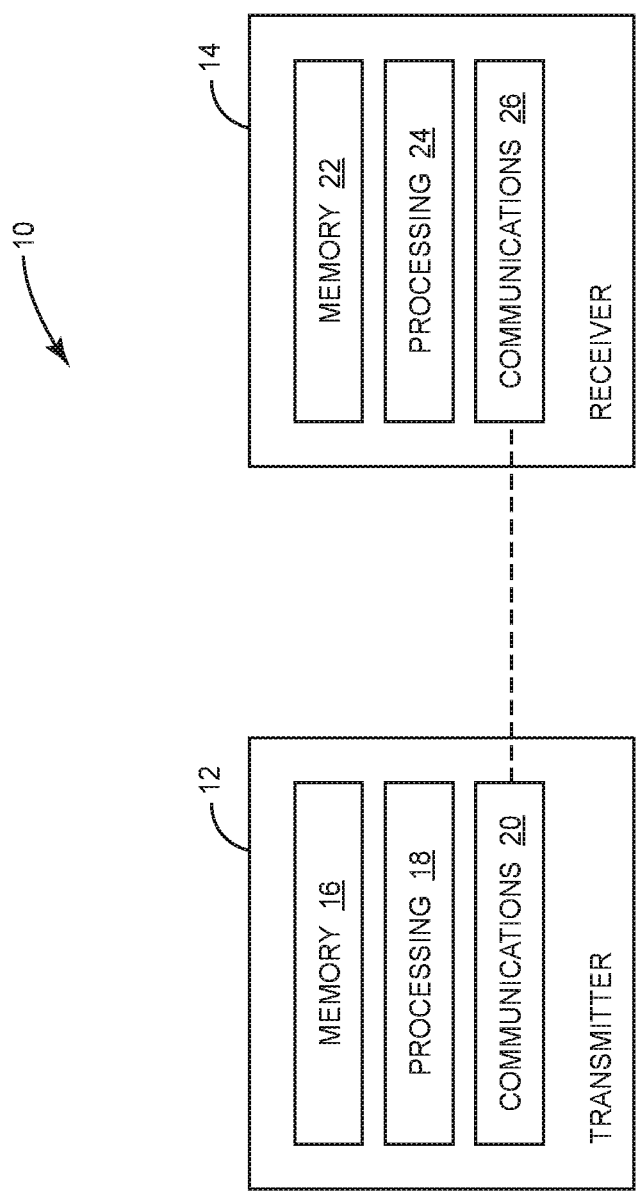
FIG. 1 is a diagram illustrating a communications system according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows a communications system 10 according to one embodiment of the present disclosure. The communications system 10 includes a transmitter 12 and a receiver 14. The transmitter 12 includes memory 16, processing circuitry 18, and communications circuitry 20. The memory 16 and the communications circuitry 20 are coupled to the processing circuitry 18. The receiver 14 also includes memory 22, processing circuitry 24, and communications circuitry 26. The memory 22 and the communications circuitry 26 are coupled to the processing circuitry 24. In operation, the transmitter 12 communicates with the receiver 14 via a stream of pulses as discussed in detail below. As discussed in detail below, the manner in which the pulses are provided allows both the transmitter 12 and the receiver 14 to be self-synchronized such that neither requires clock and data recovery (CDR) circuitry. As discussed above, CDR circuitry consumes a large amount of space and power. By communicating as discussed herein, the transmitter 12 and the receiver 14 may thus be smaller and consume less power than conventional devices. Notably, while separately labeled in FIG. 1 for purposes of illustration, both the transmitter 12 and the receiver 14 may actually both transmit and receive data from one another, communicating in a bi-directional fashion.

Figure 2:
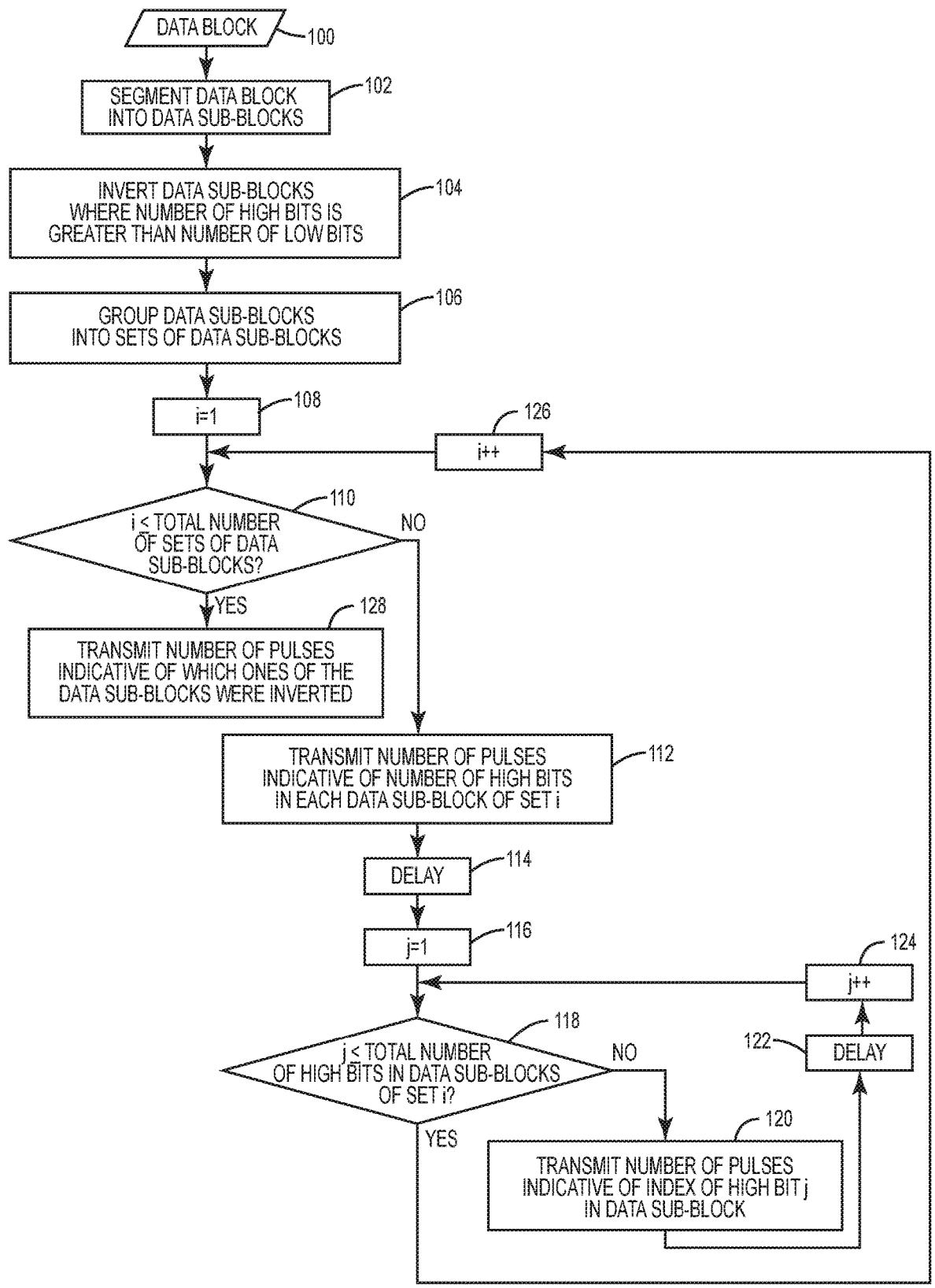
FIG. 2 is a flow diagram describing a method for transmitting a data block according to one embodiment of the present disclosure.

FIG. 2 is a flow diagram illustrating a method for transmitting a data block according to one embodiment of the present disclosure. The method starts with the data block (step 100). Those skilled in the art will readily appreciate that a data block describes data of an arbitrary size. First, the data block is segmented into a number of data sub-blocks (step 102). These data sub-blocks may be of any size, however, for purposes of discussion herein the data sub-blocks are nibbles including four bits of data. Next, each data sub-block where a number of high bits in the data sub-block is greater than a number of low bits in the data sub-block is inverted (step 104). The data sub-blocks are then grouped into sets of data sub-blocks (step 106). These sets of data sub-blocks may include any number of data sub-blocks, however, for purposes of discussion herein the sets of data sub-blocks include two data sub-blocks. Next, an iterator i is initialized to 1 (step 108). The iterator i is used to loop over the sets of data sub-blocks generated above. Accordingly, next it is determined if i is greater than the total number of sets of data sub-blocks (step 110). If i is not greater than the total number of sets of data sub-blocks, a number of pulses indicative of the number of high bits in each data sub-block of set i are transmitted (step 112). As discussed in detail below, the number of pulses transmitted in this step is based on a binary representation of the number of high bits in each of the data sub-blocks in the set. Specifically, binary representations of the number of high bits in each of the data sub-blocks in the set are concatenated and a number of pulses equal to a decimal value of the concatenated binary representations of the number of high bits in each of the data sub-blocks in the set is transmitted. The pulses transmitted in this step are metadata about the data sub-blocks in the set of data sub-blocks, where the metadata describes the number of high bits in each one of the data sub-blocks.

Next, there is a delay (step 114). As discussed in detail below, the delay separates groups of transmitted pulses such that they can be differentiated by a receiver. An iterator j is then initialized to 1 (step 116). The iterator j is used to loop over the high bits in the data sub-blocks of set i. Accordingly, next it is determined if j is greater than a total number of high bits in the data sub-blocks of set i (step 118). If j is not greater than the total number of high bits in the data sub-blocks of set i, a number of pulses indicative of an index of high bit j in the data sub-block in which the high bit is located are transmitted (step 120). The index of high bit j is the position of the bit in the data sub-block, where 0 is the index of the least significant bit (LSB). Where the size of the data sub-block is a nibble as discussed herein, the highest index is 3 (for a total of four bits). There is then another delay (step 122), j is incremented (step 124), and the process returns to step 118.

If j is greater than the total number of high bits in the data sub-blocks of set i (if all high bits in the data sub-blocks of set i have been iterated over), i is incremented (step 126), and the process returns to step 110. If i is greater than the total number of sets of data sub-blocks (if all sets of data sub-blocks have been iterated over), a number of pulses indicative of which ones of the data sub-blocks were inverted in step 104 above are transmitted (step 128). As discussed in detail below, the number of pulses transmitted in this step is based on a binary representation of which ones of the data sub-blocks were inverted. Specifically, bits representing whether each one of the data sub-blocks in the data block were inverted are concatenated and a number of pulses equal to a decimal value of the concatenated bits are transmitted. The pulses transmitted in this step are additional metadata about all of the data sub-blocks in the data block, where the metadata describes whether or not each sub-block is inverted.

Figure 3:
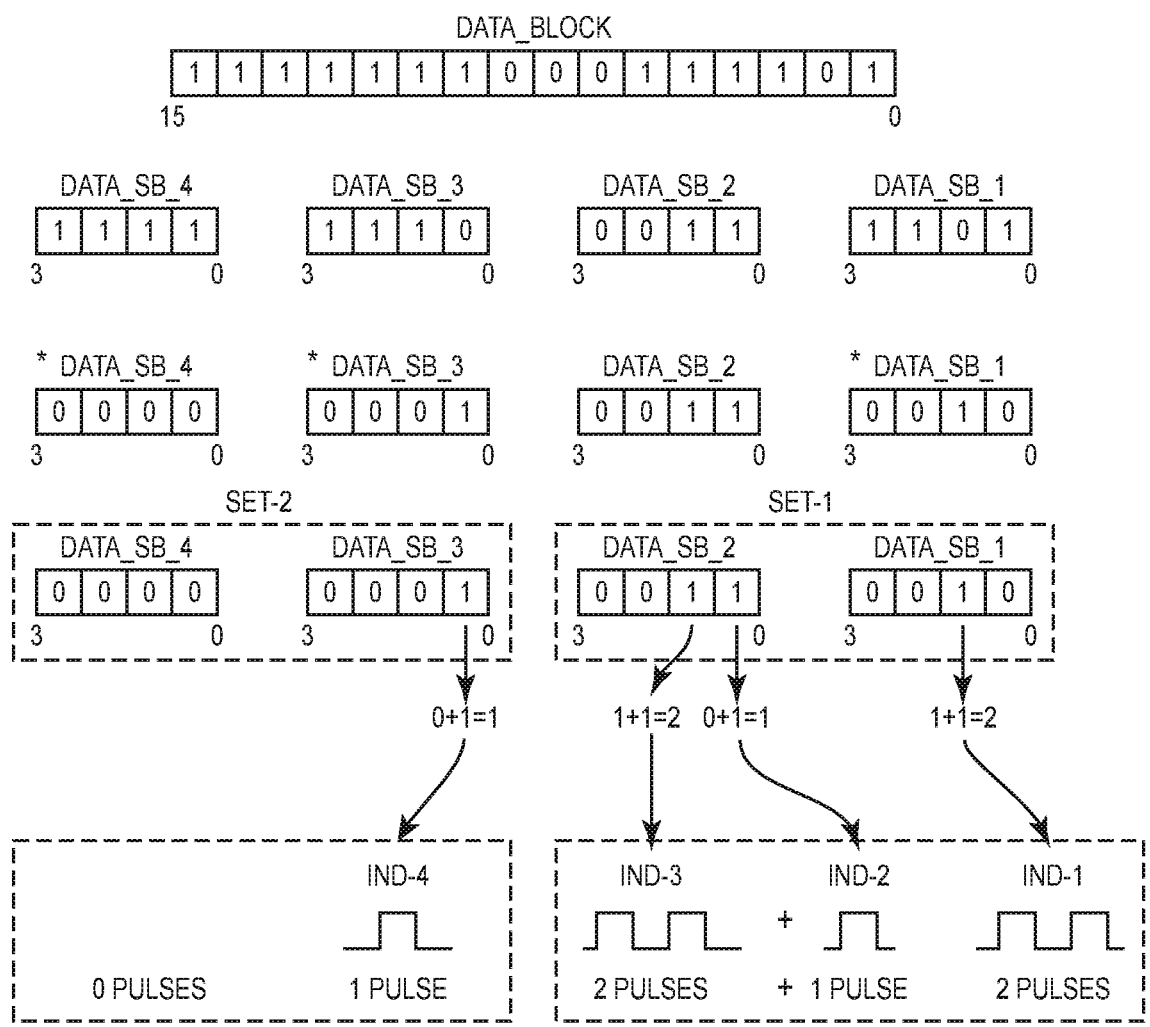
FIG. 3 is a diagram illustrating a method of encoding data into a pulse stream according to one embodiment of the present disclosure.

FIG. 3 is a diagram illustrating how the binary data in each one of the data sub-blocks is encoded into a stream of pulses. At the top, the data block (labeled DATA_BLOCK) is shown as a continuous binary string. As shown, the least significant bit (LSB) of the data block is zero indexed at the right of the data block, while the most significant bit (MSB) of the data block is at the left of the data block and has an index of 15. While the data block (DATA_BLOCK) is shown including 16 bits for purposes of illustration, those skilled in the art will readily appreciate that the data block (DATA_BLOCK) may include any number of bits without departing from the principles of the present disclosure. Moving down, the data block (DATA_BLOCK) is segmented into the data sub-blocks (labeled DATA_SB_1 through DATA_SB_4). Specifically, the data block (DATA_BLOCK) is discatenated into a number of smaller data sub-blocks (DATA_SB). As shown, the data sub-blocks (DATA_SB) are 4 bits in size, however, the present disclosure is not so limited; the data sub-blocks (DATA_SB) may be any size without departing from the principles herein. Those data sub-blocks (DATA_SB) in which the number of high bits therein exceeds the number of low bits therein are inverted, as indicated by the asterisk placed next to the inverted ones of the data sub-blocks (DATA_SB) in the next row down. The data sub-blocks (DATA_SB) are grouped into sets of data sub-blocks (SET_1 and SET_2) as illustrated by the dashed boxes surrounding the data sub-blocks in the next row. In the example shown in FIG. 3, a first set of data sub-blocks (SET_1) and a second set of data sub-block (SET_2) are shown, each including two data sub-blocks (DATA_SB). Those skilled in the art will appreciate that the any number of data sub-blocks (DATA_SB) may be included in each set of data sub-blocks (SET) and thus any number of sets of data sub-blocks (SET) may be generated for a given data block (DATA_BLOCK) without departing from the principles of the present disclosure. Finally, the index of each high bit in each one of the data sub-blocks (DATA_SB), referred to as an index value (IND), will be transmitted as a number of pulses in a pulse group. In the first data sub block (DATA_SB_1) on the right, a single high bit exists at index 1. In order to be able to communicate that a bit that exists at index 0, one is added to each index value, and thus a first index value (IND_1) will be transmitted as two pulses to indicate that a high bit exists at index 1 in the first data sub-block. Moving left, the second data sub-block (DATA_SB_2) includes a high bit at index 0 and index 1. Accordingly, a second index value (IND_2) will be transmitted as a single pulse to indicate that a high bit exists at index 0 and, after a delay, a third index value (IND_3) will be transmitted as two pulses to indicate that a high bit exists at index 1. The third data sub-block (DATA_SB_3) includes a high bit at index zero. Accordingly, a fourth index value (IND_4) will be transmitted as one pulse to indicate that a high bit exists at index 0. The fourth data sub-block (DATA_SB_4) does not include any high bits and thus no pulses will be transmitted for this data sub-block.

Figure 4A:
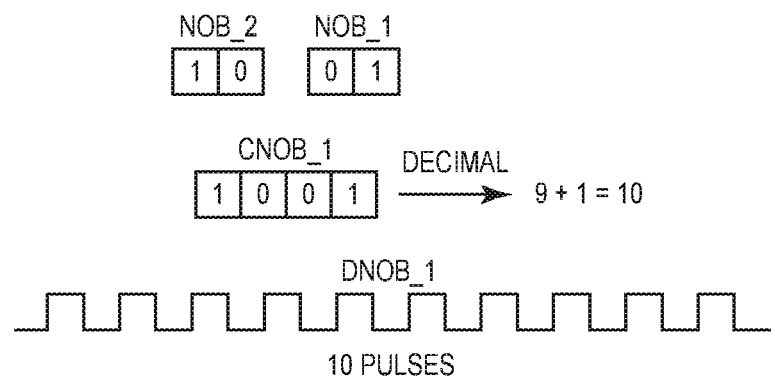
FIGS. 4A and 4B are diagrams illustrating encoding metadata into a pulse stream according to one embodiment of the present disclosure.
Figure 4B:
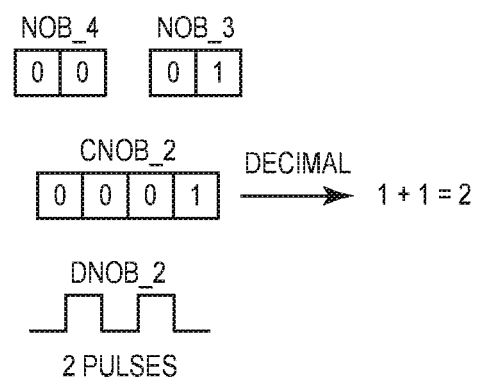

The index values (IND) by themselves, do not indicate which data sub-block (DATA_SB) the high bit they describe is located in. Accordingly, metadata describing how many high bits are in each data sub-block (DATA_SB) must be separately provided. This is done by first transmitting a pulse group for each set of data sub-blocks (SET) that describes how many high bits are in each data sub-block (DATA_SB) therein as discussed above. FIGS. 4A and 4B are diagrams illustrating how pulse groups indicating the number of high bits in the data sub-blocks (DATA_SB) of each set of data sub-blocks (SET) are generated. Moving top to bottom, a number of on bits (NOB) describing the number of high bits in each data sub-block (DATA_SB) of a set of data sub-blocks (SET) is maintained as a binary value. FIG. 4A illustrates the process for the first set of data sub-blocks (SET_1) shown in FIG. 3. Since the first data sub-block (DATA_SB_1) includes one high bit, a first number of on bits (NOB_1) associated with the first data sub-block (DATA_SB_1) is equal to 01. Since the second data sub-block (DATA_SB_2) includes two high bits, a second number of on bits (NOB_2) associated with the second data sub-block (DATA_SB_2) is equal to 10. Moving down, the first number of on bits (NOB_1) and the second number of on bits (NOB_2) are concatenated to form a first combined number of on bits (CNOB_1) with a value of 1001. The first combined number of on bits (CNOB_1) is converted to decimal, in this case 9, and 1 is added to the decimal value so that even if no high bits exist in the data sub-blocks the packet structure discussed below will be maintained (one pulse in the correct position in a pulse stream indicates that no high bits exist for a set of data sub-blocks). In the present example, a first decimal number of on bits (DNOB_1) will be transmitted as 10 pulses to indicate the number of high bits in the data sub-blocks of the first set of data sub-blocks (SET_1).

Referring to FIG. 4B, this figure illustrates the process above for the second set of data sub-blocks shown in FIG. 3. Since the third data sub-block (DATA_SB_3) includes one high bit, a third number of on bits (NOB_3) associated with the third data sub-block (DATA_SB_3) is equal to 01. Since the fourth data sub-block (DATA_SB_4) includes no high bits, a fourth number of on bits (NOB_4) associated with the fourth data sub-block (DATA_SB_4) is equal to 00. The third number of on bits (NOB_3) and the fourth number of on bits (NOB_4) are concatenated to form a second combined number of on bits (CNOB_2) with a value of 0001. The second combined number of on bits (CNOB_2) is converted to decimal, 1 in this case, and 1 is added to the decimal value to maintain the packet structure discussed below. In the present example, a second decimal number of on bits (DNOB_2) will be transmitted as two pulses to indicate the number of high bits in the data sub-blocks of the second set of data sub-blocks (SET_2).

Figure 5:
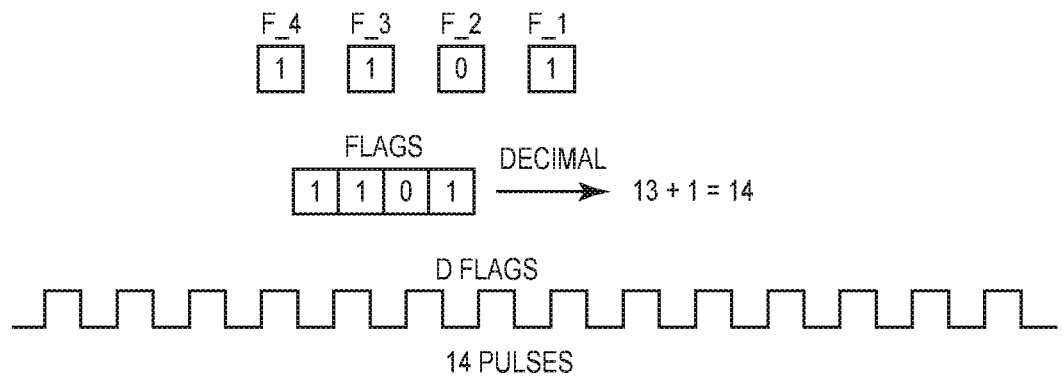
FIG. 5 is a diagram illustrating encoding metadata into a pulse stream according to one embodiment of the present disclosure.

The decimal number of on bits (DNOB) describing how many high bits are in each data sub-block (DATA_SB) of a set of data sub-blocks (SET) transmitted as metadata along with the index values (IND) is sufficient to allow a receiver to recreate all of the data sub-blocks (DATA_SB) as they were transmitted. However, some of the data sub-blocks (DATA_SB) were inverted to minimize the number of high bits therein and thus the number of pulses transmitted for the index values (IND). Accordingly, further metadata is required to allow a receiver to properly re-invert those data sub-blocks (DATA_SB) back to their original form. FIG. 5 is a diagram illustrating how the pulse group indicating which ones of the data sub-blocks (DATA_SB) were inverted is generated. Moving top to bottom, a flag bit (F) for each one of the data sub-blocks (DATA_SB) is maintained and indicates if the data sub-block (DATA_SB) was inverted or not. The flag bits (F) are each associated with a different one of the data sub-blocks (DATA_SB) such that the numbers following the flag bits (F) correspond with these following their associated data sub-block (DATA_SB). Since the first data sub-block (DATA_SB_1), the third data sub-block (DATA_SB_3), and the fourth data sub-blocks (DATA_SB_4) were inverted in the example described above in FIG. 3, a first flag bit (F_1), a third flag bit (F_3), and a fourth flag bit (F_4) are high. Moving down, the flag bits (F) are concatenated into a set of combined flags (FLAGS). While shown as a nibble including 4 bits, the set of combined flags (FLAGS) may be any length, depending on the number of data sub-blocks included in the transmission. The set of combined flags (FLAGS) is converted to a decimal value, 13 in this case, and one is added to maintain the packet structure discussed below. In the present example, a set of decimal flags (DFLAGS) will be transmitted as 14 pulses to indicate which ones of the data sub-blocks were inverted.

Figure 6:
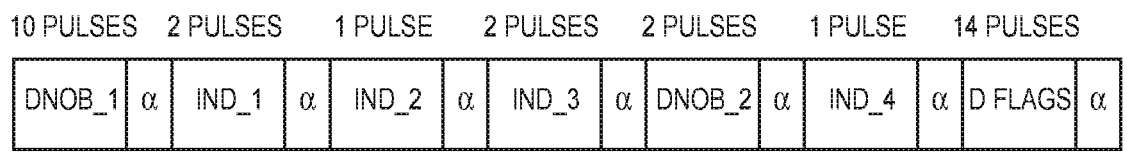
FIG. 6 is a diagram illustrating a pulsed packet structure according to one embodiment of the present disclosure.

With the decimal number of on bits (DNOB), the index values (IND), and the set of decimal flags (DFLAGS), a receiver is able to recreate the data block (DATA_BLOCK) by counting the number of pulses in each pulse group it receives. FIG. 6 illustrates how the pulse groups as generated above in FIGS. 3-5 are combined to create a packet structure that is ultimately transmitted. For each set of data sub-blocks (DATA_SB), the decimal number of on bits (DNOB) value for that set is first transmitted. Next, after a delay ($\alpha$), the index values (IND) for the data sub-blocks (DATA_SB) in the set of data sub-blocks (SET) are transmitted sequentially with delays ($\alpha$) between. This is repeated for each set of data sub-blocks (SET). Finally, the set of decimal flags (DFLAGS) are transmitted after a delay ($\alpha$). In the specific example shown in FIG. 6, the first decimal number of on bits (DNOB_1) is transmitted, followed by the first index value (IND_1), the second index value (IND_2), and the third index value (IND_3). The second decimal number of on bits (DNOB_2) is transmitted, followed by the fourth index value (IND_4). Finally, the set of decimal flags (DFLAGS) are transmitted. Notably, the foregoing packet structure is merely illustrative and those skilled in the art will readily understand that the pulse groups may be transmitted in other configurations without departing from the principles of the present disclosure.

Transmitting the index values (IND) along with the metadata of the decimal number of on bits (DNOB) and the set of decimal flags (DFLAGS) allows for the recreation of the data block (DATA_BLOCK) at a receiver by simply counting the number of pulses in each pulse group sent. Using the decimal number of on bits (DNOB) and the set of decimal flags (DFLAGS) along with the index values (IND) results in a small total number of pulses required to transmit the information in the data block (DATA_BLOCK). Further, transmitting data in the manner described above may lead to improved data rates, reliability, packet security, and power efficiency when compared to previous approaches.

The concepts discussed above with respect to FIGS. 2-6 may be encoded in instructions stored in the memory 16 of the transmitter 12. These instructions may be executed by the processing circuitry 18 such that the transmitter 12 transmits a pulsed data stream as discussed above to the receiver 14 via the communications circuitry 20. Operating the transmitter 12 in this manner allows the transmitter 12 to forego communications synchronization circuitry such as CDR circuitry. Accordingly, the transmitter 12 may be smaller and consume less power than conventional devices.

Figure 7:
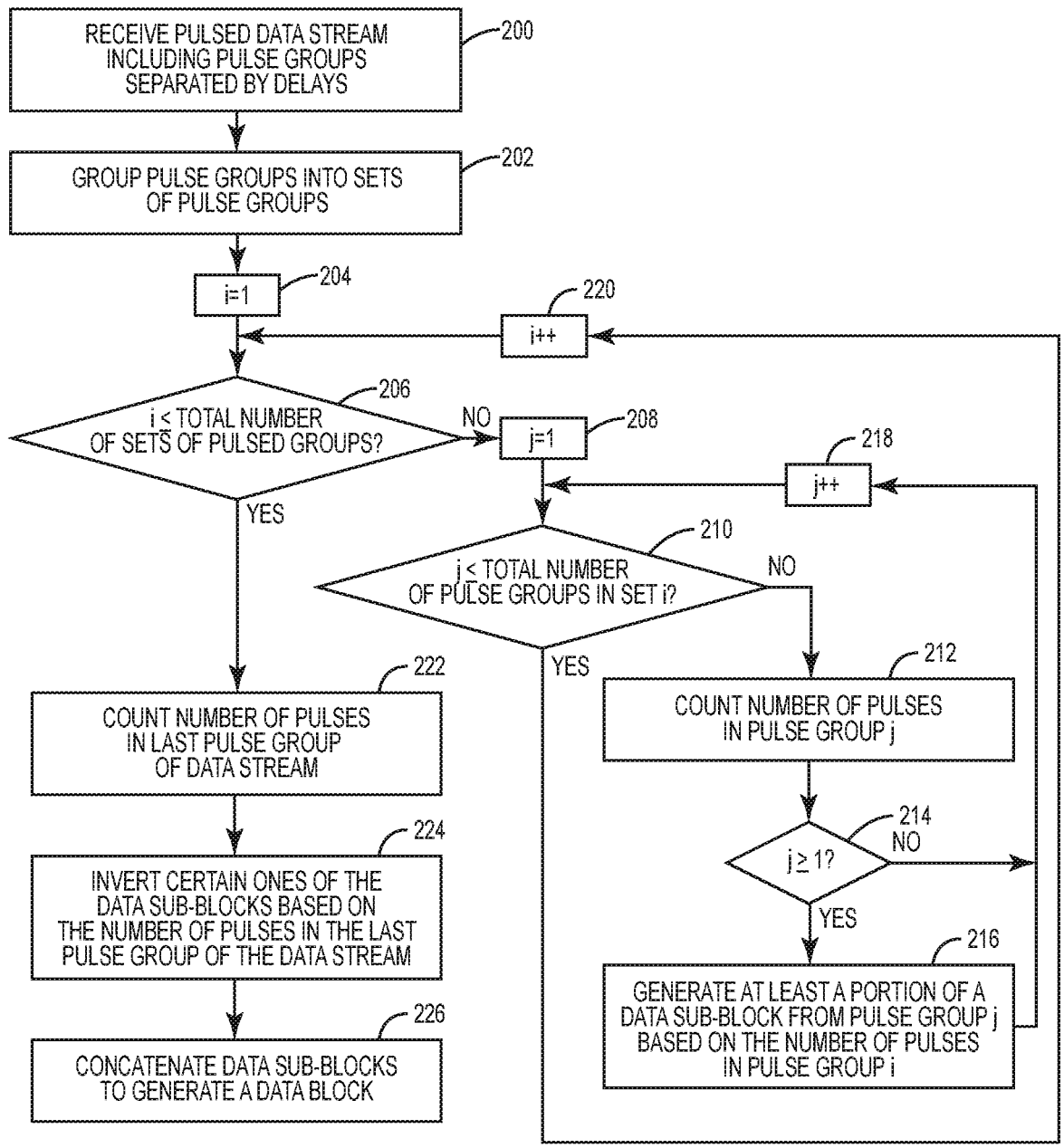
FIG. 7 is a flow diagram describing a method for receiving a data block according to one embodiment of the present disclosure.

FIG. 7 is a flow diagram illustrating a method of receiving and decoding a pulsed data stream according to one embodiment of the present disclosure. First, a pulsed data stream is received (step 200). As discussed above, the pulsed data stream includes pulse groups that are each separated by a delay (see FIG. 6). Next, the pulse groups are grouped into sets of pulse groups (step 202). The number of pulse groups in the set of pulse groups may vary in different embodiments. In one exemplary embodiment, each set of pulse groups includes the decimal number of on bits (DNOB) and the index values (IND) for the data sub-blocks for each set of data sub-blocks. A last pulse group which is the set of decimal flags (DFLAGS) is not grouped into a set of pulse groups. An iterator i is then initialized to 1 (step 204). The iterator i is used to loop over the sets of pulse groups generated above. Accordingly, next it is determined if i is greater than the total number of sets of pulse groups (step 206). If i is not greater than the total number of sets of pulse groups, an iterator j is initialized to 1 (step 208). The iterator j is used to loop over the pulse groups in set i. Accordingly, next it is determined if j is greater than the total number of pulse groups in set i (step 210). If j is not greater than the total number of pulse groups in set i, the number of pulses in pulse group j of set i are counted (step 212). It is then determined if j is greater than 1 (step 214). If j is greater than 1, at least a portion of a data sub-block is generated from pulse group j based on the number of pulses in a first pulse group of set i (step 216). As discussed above, for each set of data sub-blocks the decimal number of on bits (DNOB) is first transferred, followed by the index values (IND) for the data sub-blocks in the set of data sub-blocks. The decimal number of on bits (DNOB) indicates the number of high bits in each data sub-block in the set of data sub-blocks and thus allows for the generation of the data sub-blocks from the indices.

By way of example, a first set of pulse groups may include the first decimal number of on bits (DNOB_1), the first index value (IND_1), the second index value (IND_2), and the third index value (IND_3). The first decimal number of on bits (DNOB_1) may be counted and converted to a binary value, which indicates how many high bits are in the first data sub-block (DATA_SB_1) and the second data sub-block (DATA_SB _2). In general, the first pulse group, which is the decimal number of on bits (DNOB) is used to recreate the data sub-blocks from the remaining pulse groups in the set of pulse groups. More specifically, once the first pulse group is converted to a binary value this binary value must be decatenated (separated into the binary values for each data sub-group), and each portion of the decatenated value converted to decimal to indicate to which data sub-block the following index values belong. As discussed above, the decimal number of on bits (DNOB) may be any length and thus decatenation may involve separating the binary value into any number of sub-values depending on the number of data sub-blocks in the set of data sub-blocks. In the example discussed above, however, the decimal number of on bits (DNOB) includes four bits, with a first two of the four bits associated with a first data sub-block in the set of data sub-blocks and a second two of the four bits associated with a second data sub-block in the set of data sub-blocks. Accordingly, decatenating the binary value merely involves splitting the binary value into the first two bits and the second two bits, with the rightmost two bits corresponding to the number of high bits in the first data sub-block and the leftmost two bits corresponding to the number of high bits in the second data sub-block.

Next, j is incremented (step 218) and the process is returned to step 210). If j is greater than the total number of pulse groups in set i (if all pulse groups in set i have been iterated over), i is incremented (step 220), and the process returns to step 206. If i is greater than the total number of sets of pulse groups, the number of pulses in a last pulse group of the pulsed data stream are counted (step 222). As discussed above, the last pulse group in the pulsed data stream corresponds to the set of decimal flags (DFLAGS) and is not included in a set of pulse groups. Certain ones of the data sub-blocks created above in step 216 are then inverted based on the number of pulses in the last pulse group of the pulsed data stream (step 224). Specifically, the number of pulses in the last pulse group of the pulsed data stream is converted to a binary value that specifies which ones of the data sub-blocks were inverted before transmission. This information is then used to invert the correct data sub-blocks and thus restore the original data contained therein. Finally, the data sub-blocks are concatenated to generate the data block (step 226).

Notably, the process discussed above for receiving and decoding the pulsed data stream is only exemplary. Those skilled in the art will realize that many different ways to implement the general concepts discussed herein exist, all of which are contemplated herein. The concepts discussed above with respect to FIG. 7 may be encoded in instructions stored in the memory 22 of the receiver 14. These instructions may be executed by the processing circuitry 24 such that the receiver 14 receives a pulsed data stream from the transmitter 12 and decodes it to recreate the original data block. Operating the receiver 14 in this manner allows the receiver 14 to forego communications synchronization circuitry such as CDR circuitry. Accordingly, the receiver 14 may be smaller and consume less power than conventional devices.

Those skilled in the art will recognize improvements and modifications to the preferred embodiments of the present disclosure. All such improvements and modifications are considered within the scope of the concepts disclosed herein and the claims that follow.

What is claimed is:

1. A method for communicating a data block, the method comprising-transmitting
   the data block by:
      segmenting the data block into a plurality of data sub-blocks;
      inverting each one of the plurality of data sub-blocks if a number of high bits in the data sub-block is greater than a number of low bits in the data sub-block;
      grouping the plurality of data sub-blocks into sets of data sub-blocks;
      for each set of data sub-blocks:
         transmitting a number of pulses indicative of a number of high bits in each one of the data sub-blocks in the set of data sub-blocks;
         waiting for a delay;
         for each high bit in each data sub-block in the set of data sub-blocks:
            transmitting a number of pulses indicative of an index of the high bit in the data sub-block; and
            waiting for a delay
         transmitting a number of pulses indicative of which ones of the plurality of data sub-blocks were inverted; and
   decoding a pulsed data stream by:
      receiving the pulsed data stream, the pulsed data stream comprising pulse groups each including a number of pulses and separated from one another by a delay;
      grouping the pulse groups into sets of pulse groups;
      for each set of pulse groups:
         counting a number of pulses in each pulse group of the set of pulse groups; and
         using the number of pulses in a first one of the pulse groups of the set of pulse groups to generate a number of data sub-blocks from the remaining pulse groups of the set of pulse groups;
      counting a number of pulses in a last pulse group of the pulsed data stream;
      inverting certain ones of the data sub-blocks based on the number of pulses in the last pulse group of the pulsed data stream; and
      concatenating the data sub-blocks to generate a binary data block.

2. The method of claim 1 wherein transmitting the number of pulses indicative of the number of high bits in each one of the data sub-blocks in the set of data sub-blocks comprises:
   generating a binary representation of the number of high bits in each data sub-block in the set of data sub-blocks;
   concatenating the binary representation of the number of high bits in each data sub-block in the set of data sub-blocks to generate a concatenated binary high bit count; and
   transmitting a number of pulses equal to a decimal value of the concatenated binary high bit count.

3. The method of claim 2 wherein transmitting the number of pulses indicative of which ones of the plurality of data sub-blocks were inverted comprises:
   generating a binary representation of which ones of the plurality of data sub-blocks were inverted to generate a binary inverted count, wherein each bit of the binary inverted count is indicative of whether or not a data sub-block was inverted; and
   transmitting a number of pulses equal to a decimal value of the binary inverted count.

4. The method of claim 1 wherein transmitting the number of pulses indicative of which ones of the plurality of data sub-blocks were inverted comprises:
   generating a binary representation of which ones of the plurality of data sub-blocks were inverted to generate a binary inverted count, wherein each bit of the binary inverted count is indicative of whether or not a data sub-block was inverted; and
   transmitting a number of pulses equal to a decimal value of the binary inverted count.

5. The method of claim 1 wherein the number of pulses are transmitted via a single wire serial interface.

6. The method of claim 1 wherein the number of pulses are transmitted wirelessly.

7. The method of claim 1 wherein using the number of pulses in the first one of the pulse groups of the set of pulse groups to generate the number of data sub-blocks from the remaining pulse groups of the set of pulse groups comprises using a binary representation of the number of pulses in the first one of the pulse groups of the set of pulse groups to generate the number of data sub-blocks from the remaining pulse groups of the set of pulse groups.

8. The method of claim 7 wherein the binary representation of the number of pulses in the first one of the pulse groups of the set of pulse groups is generated by performing a decimal to binary conversion on the number of pulses in the first one of the pulse groups of the set of pulse groups.

9. The method of claim 8 wherein using the binary representation of the number of pulses in the first one of the pulse groups of the set of pulse groups to generate the number of data sub-blocks from the remaining pulse groups of the set of pulse groups comprises:
   discatenating the binary representation of the number of pulses in the first one of the pulse groups of the set of pulse groups to generate a binary representation of the number of high bits in each one of the data sub-blocks; and
   for each high bit in each one of the data sub-blocks, using the number of pulses in a corresponding pulse group in the remaining pulse groups to determine an index of the high bit.

10. The method of claim 7 wherein using the binary representation of the number of pulses in the first one of the pulse groups of the set of pulse groups to generate the number of data sub-blocks from the remaining pulse groups of the set of pulse groups comprises:
   discatenating the binary representation of the number of pulses in the first one of the pulse groups of the set of pulse groups to generate a binary representation of the number of high bits in each one of the data sub-blocks; and for each high bit in each one of the data sub-blocks, using the number of pulses in a corresponding pulse group in the remaining pulse groups to determine an index of the high bit.

11. The method of claim 10 wherein inverting certain ones of the data sub-blocks based on the number of pulses in the last pulse group of the pulsed data stream comprises inverting certain ones of the data sub-blocks based on a binary representation of the number of pulses in the last pulse group of the pulsed data stream.

12. The method of claim 11 wherein the binary representation of the number of pulses in the last pulse group of the pulsed data stream is generated by performing a decimal to binary conversion on the number of pulses in the last pulse group of the pulsed data stream.

13. The method of claim 12 wherein inverting certain ones of the data sub-blocks based on the binary representation of the number of pulses in the last pulse group of the pulsed data stream comprises inverting certain ones of the data sub-blocks based on an index of high bits in the binary representation of the number of pulses in the last pulse group.

14. The method of claim 11 wherein inverting certain ones of the data sub-blocks based on the binary representation of the number of pulses in the last pulse group of the pulsed data stream comprises inverting certain ones of the data sub-blocks based on an index of high bits in the binary representation of the number of pulses in the last pulse group.

* * * * *